(12) United States Patent
Song et al.

(10) Patent No.: US 7,884,457 B2
(45) Date of Patent: Feb. 8, 2011

(54) INTEGRATED CIRCUIT PACKAGE SYSTEM WITH DUAL SIDE CONNECTION

(75) Inventors: Sungmin Song, Inchon (KR); SeungYun Ahn, Ichon-si (KR); JoHyun Bae, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 62 days.

(21) Appl. No.: 11/768,640

(22) Filed: Jun. 26, 2007

(65) Prior Publication Data
US 2009/0001612 A1 Jan. 1, 2009

(51) Int. Cl.
*H01L 23/02* (2006.01)
(52) U.S. Cl. ....................... 257/686; 257/787
(58) Field of Classification Search ................. 257/684, 257/686, 784, 787, 685, E25.013
See application file for complete search history.

(56) References Cited

U.S. PATENT DOCUMENTS

| | | | |
|---|---|---|---|
| 5,780,924 A | 7/1998 | McCormick | |
| 6,472,758 B1 | 10/2002 | Glenn et al. | |
| 6,876,066 B2 | 4/2005 | Fee et al. | |
| 2003/0178710 A1 | 9/2003 | Kang et al. | |
| 2006/0220256 A1 | 10/2006 | Shim et al. | |
| 2006/0244157 A1* | 11/2006 | Carson | 257/787 |
| 2007/0090495 A1 | 4/2007 | Kim et al. | |
| 2007/0216005 A1* | 9/2007 | Yim et al. | 257/686 |

FOREIGN PATENT DOCUMENTS

WO  WO2006043388  *  4/2006

* cited by examiner

*Primary Examiner*—Steven Loke
*Assistant Examiner*—Kimberly M Thomas
(74) *Attorney, Agent, or Firm*—Mikio Ishimaru

(57) ABSTRACT

An integrated circuit package system comprising: connecting an integrated circuit die with a bottom connection structure; placing an adhesive encapsulation over the integrated circuit die and the bottom connection structure with the bottom connection structure exposed; and placing a top connection structure over the adhesive encapsulation at an opposing side to the bottom connection structure.

7 Claims, 7 Drawing Sheets

INTEGRATED CIRCUIT PACKAGE SYSTEM WITH DUAL SIDE CONNECTION

TECHNICAL FIELD

The present invention relates generally to an integrated circuit package system, and more particularly to an integrated circuit package system with multiple integrated circuits.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on packing more integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever-shrinking physical space with expectations for decreasing cost. Numerous technologies have been developed to meet these requirements. Some of the research and development strategies focus on new package technologies while others focus on improving the existing package technologies.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever-demanding integration of today's integrated circuits and packages.

There are numerous packaging approaches such as stacking multiple integrated circuit dice into a package, a package-in-package (PIP), a package on package (POP), or a combination thereof. It becomes increasingly complex to accommodate the numerous electrical connections to the each of the integrated circuits as more integrated circuits are packed into a single package.

For example, conventional vertically stacked multi-chip packages require space for forming electrical connections, such as with bond wires, and typically formed by spacers, such as silicon or interposers. Current spacers require additional steps and structures increasing manufacturing costs and decreasing manufacturing yields. These spacers also limit the amount of height reduction. Conventional PIP and POP configurations require space for the package integration and/or stack limiting the reduction of the package height.

In addition, high-speed digital systems may switch at a high rate, such as more than one gigahertz. At such switching speeds, switching currents radiate energy (noise) that interferes with sensitive analog circuits or even other digital circuits. Interference usually takes the form of signal crosstalk.

Electromagnetic interference (EMI) is a generic term for unwanted interference energies either conducted as currents or radiated as electromagnetic fields. EMI can emanate from electronic devices in several ways. Generally, voltages and currents from integrated circuits create electric and magnetic fields that radiate from the integrated circuit device. EMI radiating from such integrated circuit devices will vary in field strength and impedance according to the shape and orientation of the conductors, the distance from the conductors to any shielding provided by circuit components or by coupling to circuit components.

One typical scheme has been to provide a conductive enclosure to an electronic device so that EMI field lines will terminate on such enclosure. Unfortunately, conductive enclosures that contain the entire product or parts of the product can be very expensive. In addition, the need to increase integrated circuit density has led to the development of multi-chip packages in which more than one integrated circuit can be packaged.

The trend is to pack more integrated circuits and different types of integrated circuits into a single package require EMI shielding within the package. Typically, metallic or conductive enclosures isolate the various integrated circuits from each other in a package. These conductive enclosures must also be grounded so the EMI radiated energy may be absorbed by the system as opposed to being radiated into the environment or to other integrated circuits. These solutions add manufacture complexity, manufacturing cost, and hamper the size reduction of the multi-chip packages.

Further, as more integrated circuits and different types of integrated circuits are forming more complex multi-chip packages, it become increasingly important to test the integrated circuits prior to final assembly of the multi-chip packages. This ensures known good units (KGU) of the integrated circuits otherwise the multi-chip package yield may be adversely impacted as well as increasing the cost of the multi-chip package.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

An integrated circuit package system comprising: connecting an integrated circuit die with a bottom connection structure; placing an adhesive encapsulation over the integrated circuit die and the bottom connection structure with the bottom connection structure exposed; and placing a top connection structure over the adhesive encapsulation at an opposing side to the bottom connection structure.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
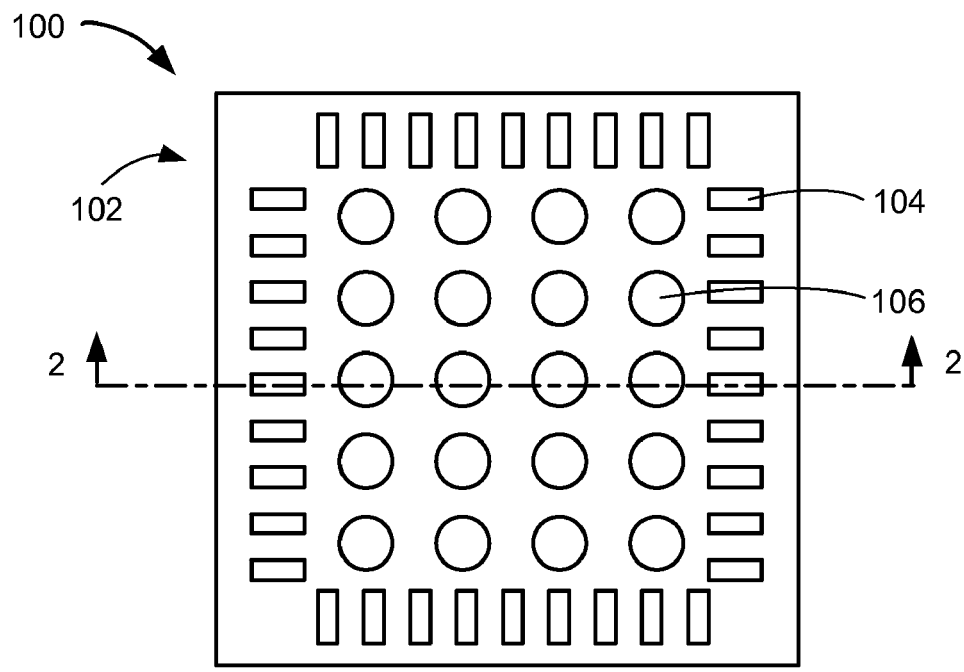
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts a top connection structure 102, such as a laminate substrate, preferably with first peripheral pads 104, such as terminal pads, and first interior pads 106, such as contact pads. The first peripheral pads 104 are preferably at a periphery portion of the top connection structure 102. The first interior pads 106 are preferably at an interior portion of the top connection structure 102 and within the periphery portion outlined by the first peripheral pads 104.

For illustrative purposes, the first peripheral pads 104 and the first interior pads 106 are shown with different geometric configuration, although it is understood that the first peripheral pads 104 and the first interior pads 106 may have the same geometric configurations. For example, both the first peripheral pads 104 and the first interior pads 106 may have rectangular or circular geometric configurations. Also for illustrative purposes, the top connection structure 102 is shown with the first peripheral pads 104 and the first interior pads 106, although it is understood that the top connection structure 102 may have a different number of connection locations and different types of connection pads.

Figure 2:
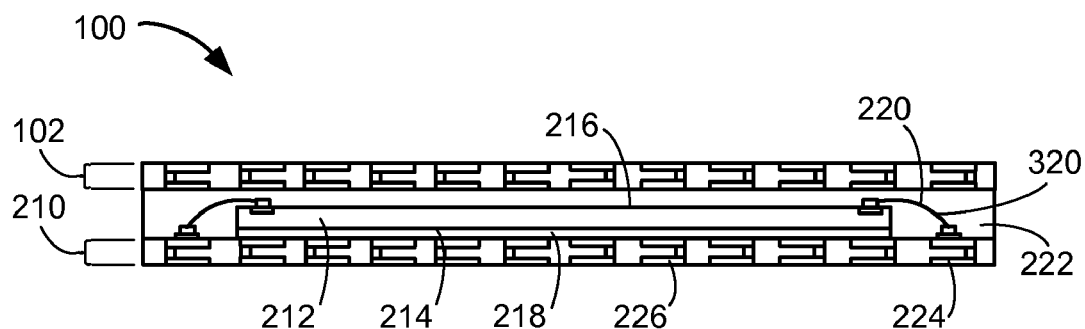
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the integrated circuit package system 100 having dual connections options from the top with the top connection structure 102 and from the bottom with a bottom connection structure 210, such as a laminate substrate.

The top connection structure 102 is preferably above the bottom connection structure 210 with an integrated circuit die 212 thereover. A non-active side 214 of the integrated circuit die 212 preferably faces the bottom connection structure 210. An active side 216 of the integrated circuit die 212 preferably faces the top connection structure 102. A backside adhesive 218, such as a die-attach adhesive, connects the non-active side 214 of the integrated circuit die 212 and the bottom connection structure 210. Internal interconnects 220, such as bond wires or ribbon bond wires, connect the integrated circuit die 212 and the bottom connection structure 210.

An adhesive encapsulation 222 preferably covers the integrated circuit die 212 and the internal interconnects 220 over the bottom connection structure 210. The adhesive encapsulation 222 may be formed from a number of materials. For example, the adhesive encapsulation 222 may be formed from an underfill adhesive having nitride blend, wherein the underfill adhesive preferably has high temperature resistance and is thermally conductive. As another example, the adhesive encapsulation 222 may be formed from an epoxy adhesive. Yet another example, the adhesive encapsulation 222 may be formed with a B-stage adhesive, such as a wire on film (WIF) adhesive.

The adhesive encapsulation 222 is below the top connection structure 102 forming the integrated circuit package system 100. The top connection structure 102, the bottom connection structure 210, and the adhesive encapsulation 222 in between provide mechanical rigidity for the integrated circuit package system 100 for further handling and processing.

The top connection structure 102 preferably provides a redistribution layer (RDL) for the external connections not within the adhesive encapsulation 222. The bottom connection structure 210 preferably provides connectivity for the integrated circuit die 212 with the external environment. The bottom connection structure 210 may also preferably serve as a redistribution layer (RDL) between the input/outputs (I/Os) of the integrated circuit die 212 and for the external connections not within the adhesive encapsulation 222.

The bottom connection structure 210 preferably has second peripheral pads 224, such as terminal pads, and second interior pads 226, such as contact pads. The second peripheral pads 224 are preferably located at a periphery portion of the bottom connection structure 210. The second interior pads 226 are preferably located at an interior portion of the bottom connection structure 210, wherein the interior portion is within the periphery portion.

Figure 3:
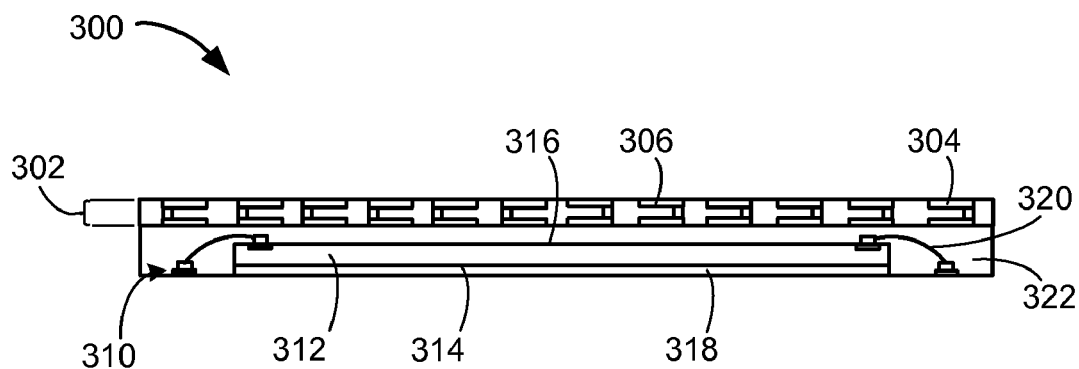
FIG. 3 is a cross-sectional view of an integrated circuit package system exemplified by the top view along line 2-2 of FIG. 1 in a second embodiment of the present invention.

Referring now to FIG. 3, therein is shown a cross-sectional view of an integrated circuit package system 300 exemplified by the top view along line 2-2 of FIG. 1 in a second embodiment of the present invention. The cross-sectional view depicts the integrated circuit package system 300 having dual connections options from the top with a top connection structure 302, such as laminate substrate, and from the bottom with a bottom connection structure 310, such as terminal pads.

The top connection structure 302 preferably includes first peripheral pads 304, such as terminal pads, and first interior pads 306, such as contact pads. The first peripheral pads 304 are preferably at a periphery portion of the top connection structure 302. The first interior pads 306 are preferably at an interior portion of the top connection structure 302, wherein the interior portion is within the periphery portion.

The top connection structure 302 is preferably above the bottom connection structure 310. An integrated circuit die 312 is preferably over a backside adhesive 318, such as a die-attach adhesive or a backside concealer. A non-active side 314 of the integrated circuit die 312 preferably faces a plane of the bottom connection structure 310 and preferably attaches to the backside adhesive 318. An active side 316 of the integrated circuit die 312 preferably faces the top connection structure 302. Internal interconnects 320, such as bond wires or ribbon bond wires, connect the integrated circuit die 312 and the bottom connection structure 310.

An adhesive encapsulation 322 preferably covers the integrated circuit die 312 and the internal interconnects 320. The adhesive encapsulation 322 preferably exposes the bottom connection structure 310 and the backside adhesive 318. The backside adhesive 318 may serve a number of functions. For example, the backside adhesive 318 protects the integrated circuit die 312 from ambient preventing chipping and cracking. As another example, the backside adhesive 318 may also be used during the manufacturing of the integrated circuit package system 300.

For illustrative purposes, the backside adhesive 318 is shown attached to the integrated circuit die 312, although it is understood that the backside adhesive 318 may not cover the non-active side 314. For example, the backside adhesive 318 may be optional with the adhesive encapsulation 322 exposing the non-active side 314. The non-active side 314 may be coplanar with the adhesive encapsulation 322 or form a cavity with the adhesive encapsulation 322.

The adhesive encapsulation 322 may be formed from a number of materials. For example, the adhesive encapsulation 322 may be formed from an underfill adhesive having nitride blend, wherein the underfill adhesive are preferably high temperature resistance and thermally conductive. As another example, the adhesive encapsulation 322 may be formed form an epoxy adhesive. Yet another example, the adhesive encapsulation 322 may be formed with a B-stage adhesive, such as a wire on film (WIF) adhesive. The top connection structure 302 and the adhesive encapsulation 322 preferably provide mechanical rigidity for the integrated circuit package system 300 for further handling and processing.

The top connection structure 302 preferably provides a redistribution layer (RDL) for the external connections not within the adhesive encapsulation 322. The bottom connection structure 310 preferably provides connectivity for the integrated circuit die 312 with the external environment.

Figure 4:
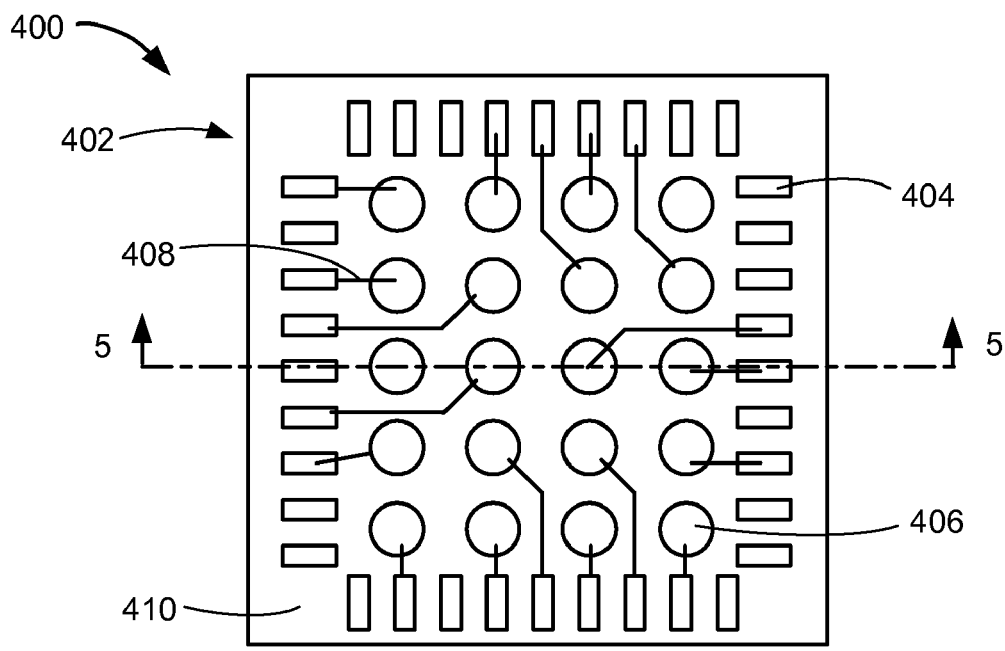
FIG. 4 is a top view of an integrated circuit package system in a third embodiment of the present invention.

Referring now to FIG. 4, therein is shown a top view of an integrated circuit package system 400 in a third embodiment of the present invention. The top view depicts a top connection structure 402, such as patterned conductive structures, preferably with first peripheral pads 404, such as terminal pads, and first interior pads 406, such as contact pads. The first peripheral pads 404 are preferably at a periphery portion of the top connection structure 402. The first interior pads 406 are preferably at an interior portion of the top connection structure 402 and within the periphery portion outlined by the first peripheral pads 404. Conductive lines 408, such as routing traces, preferably connect a predetermined location of the first peripheral pads 404 with a predetermined location of the first interior pads 406.

For illustrative purposes, the first peripheral pads 404 and the first interior pads 406 are shown with different geometric configuration, although it is understood that the first peripheral pads 404 and the first interior pads 406 may have the same geometric configurations. For example, both the first peripheral pads 404 and the first interior pads 406 may have rectangular or circular geometric configurations. Also for illustrative purposes, the top connection structure 402 is shown with the first peripheral pads 404 and the first interior pads 406, although it is understood that the top connection structure may have a different number of connection locations and different types of connection pads.

Further for illustrative purposes, the conductive lines 408 are shown between predetermined locations of the first peripheral pads 404 and the first interior pads 406, although it is understood that the conductive lines 408 may form other electrical connections. For example, the conductive lines 408 may connect a predetermined portion of the first peripheral pads 404 to each other. As another example, the conductive lines 408 may connect a predetermined portion of the first interior pads 406 to each other.

An adhesive encapsulation 410 surrounds and exposes the top connection structure 402 including the first peripheral pads 404 and the first interior pads 406. The adhesive encapsulation 410 may be formed from a number of materials. For example, the adhesive encapsulation 410 may be formed from an underfill adhesive having nitride blend, wherein the underfill adhesive preferably has high temperature resistance and is thermally conductive. As another example, the adhesive encapsulation 410 may be formed form an epoxy adhesive. Yet another example, the adhesive encapsulation 410 may be formed with a B-stage adhesive, such as a wire on film (WIF) adhesive.

Figure 5:
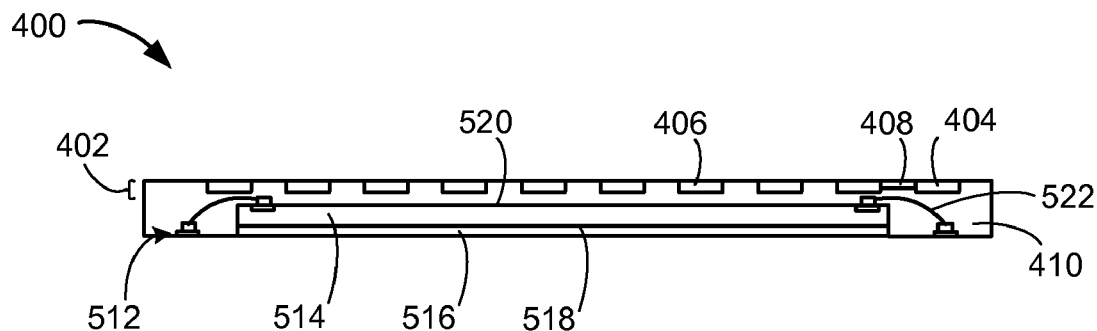
FIG. 5 is a cross-sectional view of the integrated circuit package system along line 5-5 of FIG. 4.

Referring now to FIG. 5, therein is shown a cross-sectional view of the integrated circuit package system 400 along line 5-5 of FIG. 4. The cross-sectional view depicts the integrated circuit package system 400 having dual connections options from the top with the top connection structure 402 and from the bottom with a bottom connection structure 512, such as terminal pads.

The top connection structure 402 preferably includes the first peripheral pads 404, the first interior pads 406, and the conductive lines 408. The top connection structure 402 is preferably above the bottom connection structure 512. An integrated circuit die 514 is preferably over a backside adhesive 516, such as a die-attach adhesive or a backside concealer. A non-active side 518 of the integrated circuit die 514 preferably faces a plane of the bottom connection structure 512 and preferably attaches to the backside adhesive 516. An active side 520 of the integrated circuit die 514 preferably faces the top connection structure 402. Internal interconnects 522, such as bond wires or ribbon bond wires, connect the integrated circuit die 514 and the bottom connection structure 512.

The adhesive encapsulation 410 preferably covers the integrated circuit die 514 and the internal interconnects 522. The adhesive encapsulation 410 preferably exposes the bottom connection structure 512 and the backside adhesive 516. The backside adhesive 516 may serve a number of functions. For example, the backside adhesive 516 protects the integrated circuit die 514 from ambient preventing chipping and cracking. As another example, the backside adhesive 516 may also be used during the manufacturing of the integrated circuit package system 400.

For illustrative purposes, the backside adhesive 516 is shown attached to the integrated circuit die 514, although it is understood that the backside adhesive 516 may not cover the non-active side 518. For example, the backside adhesive 516 may be optional with the adhesive encapsulation 410 exposing the non-active side 516. The non-active side 516 may be coplanar with the adhesive encapsulation 410 or form a cavity with the adhesive encapsulation 410.

The top connection structure 402 preferably provides a redistribution layer (RDL) for the external connections not within the adhesive encapsulation 410. The bottom connection structure 512 preferably provides connectivity for the integrated circuit die 514 with the external environment.

Figure 6:
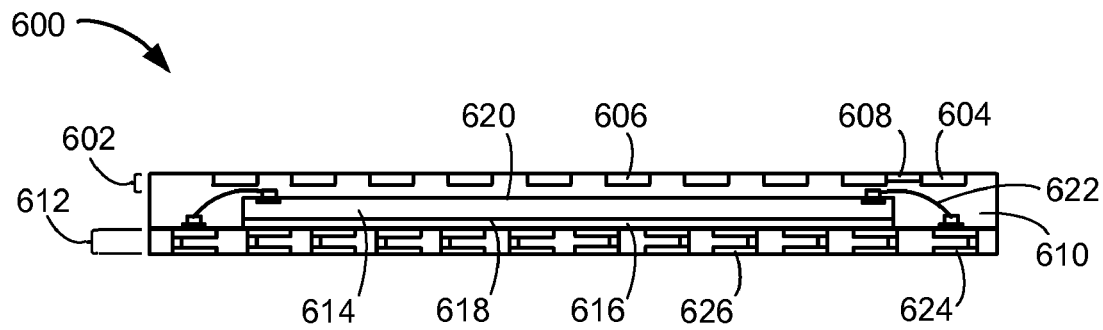
FIG. 6 is a cross-sectional view of an integrated circuit package system exemplified by the top view along line 5-5 of FIG. 4 in a fourth embodiment of the present invention.

Referring now to FIG. 6, therein is shown a cross-sectional view of an integrated circuit package system 600 exemplified by the top view along line 5-5 of FIG. 4 in a fourth embodiment of the present invention. The cross-sectional view depicts the integrated circuit package system 600 having dual connections options from the top with a top connection structure 602, such as a patterned conductive structures, and from the bottom with a bottom connection structure 612, such as a laminate substrate.

The top connection structure 602 preferably includes first peripheral pads 604, first interior pads 606, and conductive lines 608. The top connection structure 602 is preferably above the bottom connection structure 612 with an integrated circuit die 614 thereover. A non-active side 618 of the integrated circuit die 614 preferably faces the bottom connection structure 612. An active side 620 of the integrated circuit die 614 preferably faces the top connection structure 602. A backside adhesive 616, such as a die-attach adhesive, connects the non-active side 618 of the integrated circuit die 614 and the bottom connection structure 612. Internal interconnects 622, such as bond wires or ribbon bond wires, connect the integrated circuit die 614 and the bottom connection structure 612.

An adhesive encapsulation 610 preferably covers the integrated circuit die 614 and the internal interconnects 622 over the bottom connection structure 612. The adhesive encapsulation 610 may be formed from a number of materials. For example, the adhesive encapsulation 610 may be formed from an underfill adhesive having nitride blend, wherein the underfill adhesive are preferably high temperature resistance and thermally conductive. As another example, the adhesive encapsulation 610 may be formed form an epoxy adhesive. Yet another example, the adhesive encapsulation 610 may be formed with a B-stage adhesive, such as a wire on film (WIF) adhesive.

The top connection structure 602 preferably provides a redistribution layer (RDL) for the external connections not within the adhesive encapsulation 610. The bottom connection structure 612 preferably provides connectivity for the integrated circuit die 614 with the external environment. The bottom connection structure 612 may also preferably serve as a redistribution layer (RDL) between the input/outputs (I/Os) of the integrated circuit die 614 and for the external connections not within the adhesive encapsulation 610

The bottom connection structure 612 preferably has second peripheral pads 624, such as terminal pads, and second interior pads 626, such as contact pads. The second peripheral pads 624 are preferably located at a periphery portion of the bottom connection structure 612. The second interior pads 626 are preferably located at an interior portion of the bottom connection structure 612, wherein the interior portion is within the periphery portion.

Figure 7:
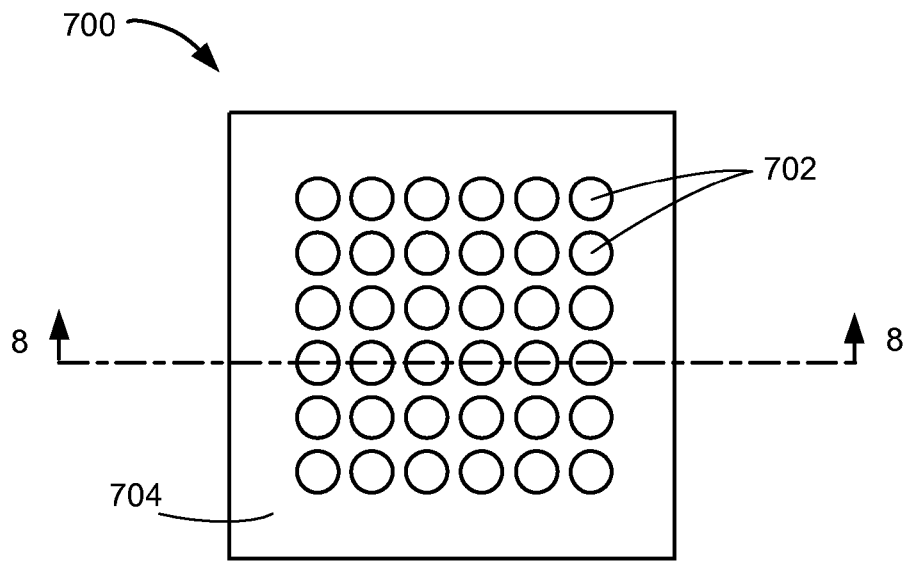
FIG. 7 is a bottom view of an integrated circuit package-on-package system having the integrated circuit package system of FIG. 1 in a fifth embodiment of the present invention.

Referring now to FIG. 7, therein is shown a bottom view of an integrated circuit package-on-package system 700 having the integrated circuit package system 100 of FIG. 1 in a fifth embodiment of the present invention. The bottom view depicts external interconnects 702, such as solder balls, attached to a package substrate 704.

For illustrative purposes, the external interconnects 702 are shown in an array configuration, although it is understood that the external interconnects 702 may be populated on the package substrate 704 in a different configuration, such as some locations may be depopulated. Also for illustrative purposes, the integrated circuit package-on-package system 700 is shown the package substrate 704 as a laminate type of carrier, although it is understood that the integrated circuit package system 100 may have other types of carrier for the package substrate 704, such as leads (not shown) formed from a lead frame (not shown).

Figure 8:
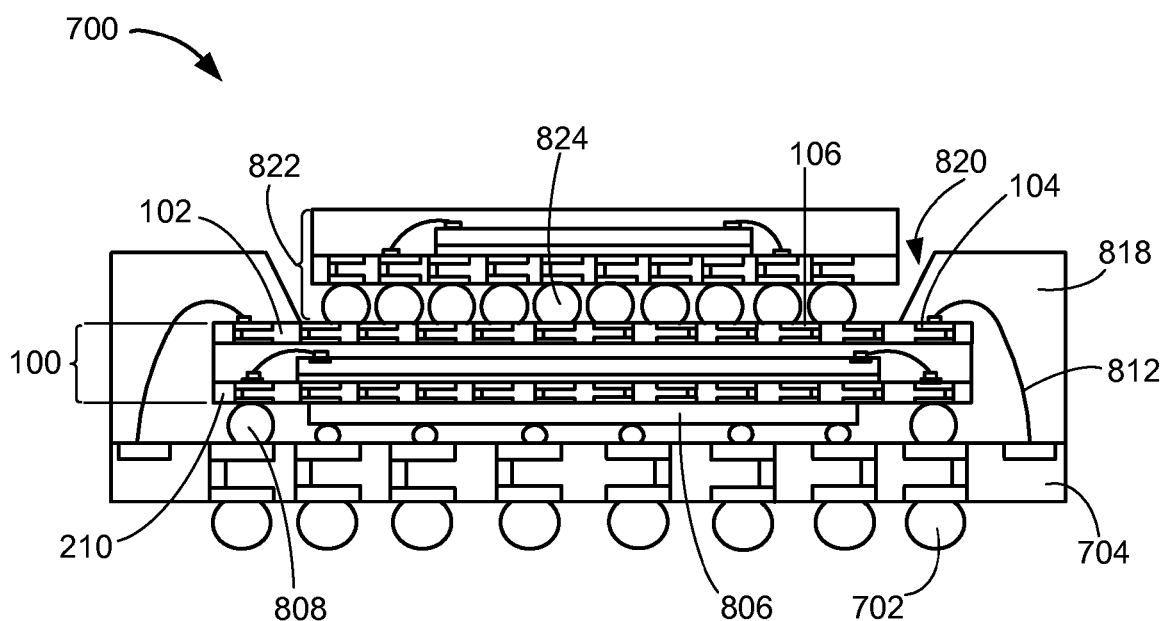
FIG. 8 is a cross-sectional view of the integrated circuit package-on-package system along line 8-8 of FIG. 7.

Referring now to FIG. 8, therein is shown a cross-sectional view of the integrated circuit package-on-package system 700 along line 8-8 of FIG. 7. A first device structure 806, such as a flip chip, preferably mounts over the package substrate 704. The integrated circuit package system 100 preferably mounts over the first device structure 806 and preferably connects to the package substrate 704 with first internal interconnects 808, such as solder balls or solder bumps. The first internal interconnects 808 preferably connects to the bottom connection structure 210 of the integrated circuit package system 100.

Second internal interconnects 812, such as bond wires or ribbon bond wires, preferably connect the first peripheral pads 104 of the top connection structure 102 and the package substrate 704. A package encapsulation 818, such as an epoxy molding compound (EMC), covers the integrated circuit package system 100, the first device structure 806, the first internal interconnects 808, and the second internal interconnects 812 over the package substrate 704. The package encapsulation 818 preferably includes a recess 820 exposing the first interior pads 106 of the top connection structure 102.

A second device structure 822, such as an encapsulated integrated circuit, preferably mounts over the first interior pads 106 in the recess 820 forming the integrated circuit package-on-package system 700. Conductive balls 824, such as solder balls, preferably connect the second device structure 822 and the first interior pads 106 of the integrated circuit package system 100.

As mentioned earlier, the integrated circuit package system 100 preferably provides a dual connection options from the top and the bottom with the top connection structure 102 and the bottom connection structure 210. The top connection structure 102 may preferably provide electrical connection paths between the second device structure 822 to the other portions of the integrated circuit package-on-package system 700 and to the next system level (not shown), such as a printed circuit board or another integrated circuit package system, through the external interconnects 702. The bottom connection structure 210 preferably provides electrical connection paths between the integrated circuit package system 100 to the other portions of the integrated circuit package-on-package system 700 and also to the next system level.

Figure 9:
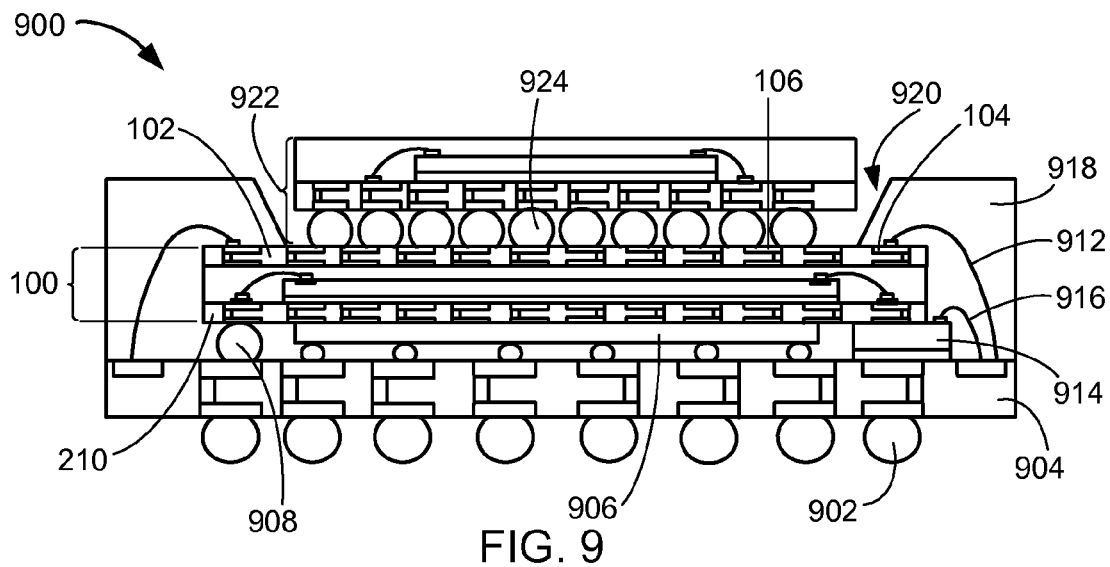
FIG. 9 is a cross-sectional view of an integrated circuit package-on-package system having the integrated circuit package system of FIG. 2 exemplified by the bottom view along line 8-8 of FIG. 7 in a sixth embodiment of the present invention.

Referring now to FIG. 9, therein is shown a cross-sectional view of an integrated circuit package-on-package system 900 having the integrated circuit package system 100 of FIG. 2 exemplified by the bottom view along line 8-8 of FIG. 7 in a sixth embodiment of the present invention. A first device structure 906, such as a flip chip, preferably mounts over a package substrate 904. The integrated circuit package system 100 preferably mounts over the first device structure 906 and preferably connects to the package substrate 904 with first internal interconnects 908, such as solder balls or solder bumps. The first internal interconnects 908 preferably connects to the bottom connection structure 210 of the integrated circuit package system 100.

Second internal interconnects 912, such as bond wires or ribbon bond wires, preferably connect the first peripheral pads 104 of the top connection structure 102 and the package substrate 904. A mounting structure 914 is preferably between the peripheral portion of the bottom connection structure 210 of the integrated circuit package system 100 and the package substrate 904. The mounting structure 914 may represent a number of structures. For example, the mounting structure 914 may be an integrated circuit die, a structure providing a redistribution layer (RDL), or a combination thereof. Third internal interconnects 916, such as bond wires or ribbon bond wires, preferably electrically connect the mounting structure 914 and the package substrate 904.

A package encapsulation 918, such as an epoxy molding compound (EMC), covers the first device structure 906, the first internal interconnects 908, the second internal interconnects 912, the mounting structure 914, and the third internal interconnects 916 over the package substrate 904. The package encapsulation 918 preferably includes a recess 920 exposing the first interior pads 106 of the top connection structure 102.

A second device structure 922, such as an encapsulated integrated circuit, preferably mounts over the first interior pads 106 in the recess 920. Conductive balls 924, such as solder balls, preferably connect the second device structure 922 and the first interior pads 106 of the integrated circuit package system 100.

As mentioned earlier, the integrated circuit package system 100 preferably provides a dual connection options from the top and the bottom with the top connection structure 102 and the bottom connection structure 210. The top connection structure 102 may preferably provide electrical connection paths between the second device structure 922 to the other portions of the integrated circuit package-on-package system 900 and to the next system level (not shown), such as a printed circuit board or another integrated circuit package system, through external interconnects 902, such as solder balls. The external interconnects 902 preferably attach to and below the package substrate 904. The bottom connection structure 210 preferably provides electrical connection paths between the integrated circuit package system 100 to the other portions of the integrated circuit package-on-package system 900 and also to the next system level.

Figure 10:
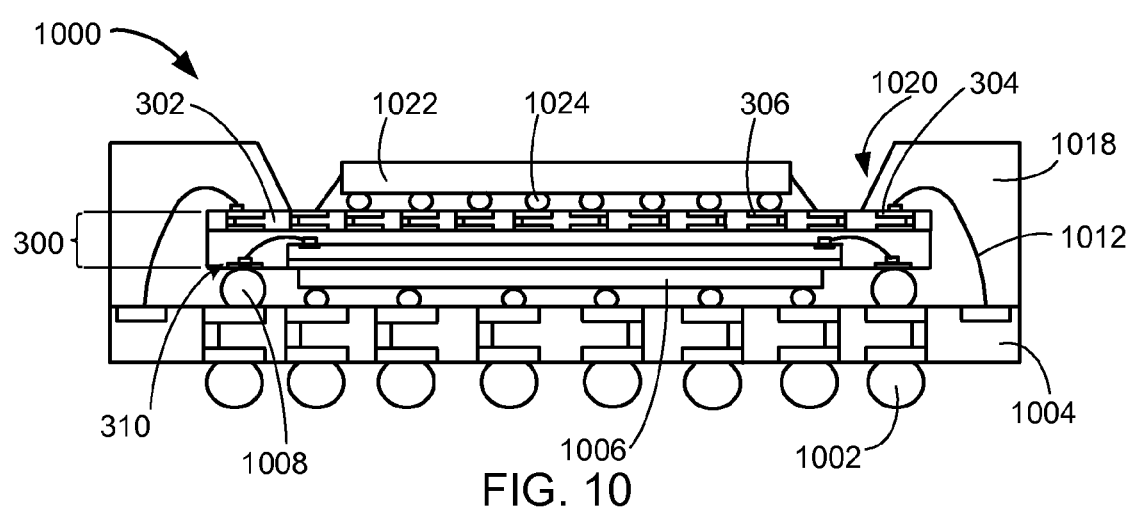
FIG. 10 is a cross-sectional view of an integrated circuit package-on-package system having the integrated circuit package system of FIG. 3 exemplified by the bottom view along line 8-8 of FIG. 7 in a seventh embodiment of the present invention.

Referring now to FIG. 10, therein is shown a cross-sectional view of an integrated circuit package-on-package system 1000 having the integrated circuit package system 300 of FIG. 3 exemplified by the bottom view along line 8-8 of FIG. 7 in a seventh embodiment of the present invention. A first device structure 1006, such as a flip chip, preferably mounts over a package substrate 1004. The integrated circuit package system 300 preferably mounts over the first device structure 1006 and preferably connects to the package substrate 1004 with first internal interconnects 1008, such as solder balls or solder bumps. The first internal interconnects 1008 preferably connects to the bottom connection structure 310 of the integrated circuit package system 300.

Second internal interconnects 1012, such as bond wires or ribbon bond wires, preferably connect the first peripheral pads 304 of the top connection structure 302 and the package substrate 1004. A package encapsulation 1018, such as an epoxy molding compound (EMC), covers the first device structure 1006, the first internal interconnects 1008, and the second internal interconnects 1012 over the package substrate 1004. The package encapsulation 1018 preferably includes a recess 1020 exposing the first interior pads 306 of the top connection structure 302.

A second device structure 1022, such as a flip chip, preferably mounts over the first interior pads 306 in the recess 1020 forming the integrated circuit package-on-package system 1000. Conductive balls 1024, such as solder bumps, preferably connect the second device structure 1022 and the first interior pads 306 of the integrated circuit package system 300.

As mentioned earlier, the integrated circuit package system 300 preferably provides a dual connection options from the top and the bottom with the top connection structure 302 and the bottom connection structure 310. The top connection structure 302 may preferably provide electrical connection paths between the second device structure 1022 to the other portions of the integrated circuit package-on-package system 1000 and to the next system level (not shown), such as a printed circuit board or another integrated circuit package system, through external interconnects 1002. The bottom connection structure 310 preferably provides electrical connection paths between the integrated circuit package system 300 to the other portions of the integrated circuit package-on-package system 1000 and also to the next system level.

Figure 11:
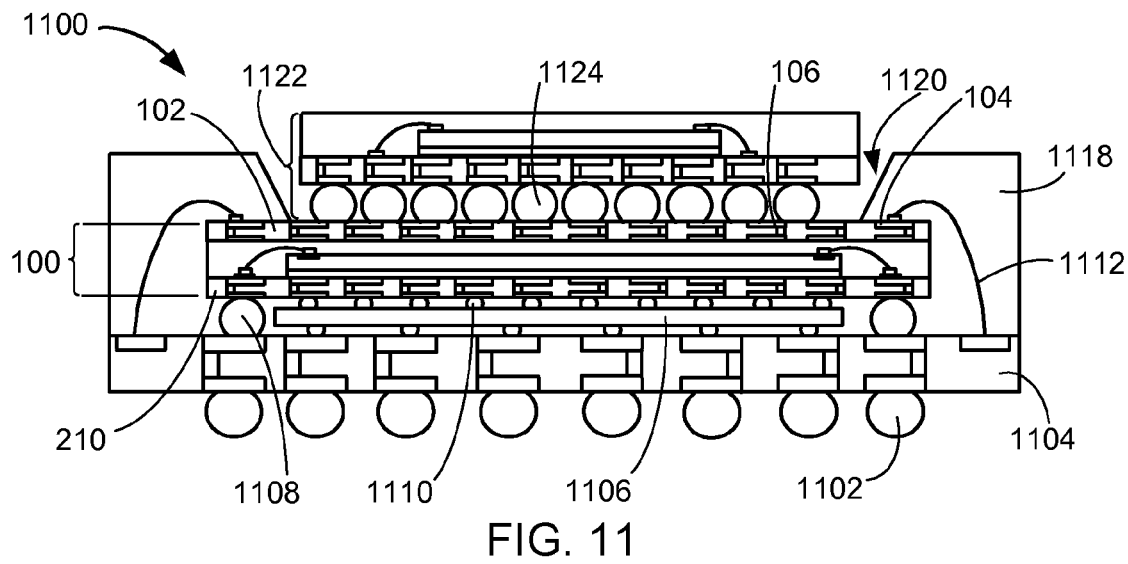
FIG. 11 is a cross-sectional view of an integrated circuit package-on-package system having the integrated circuit package system of FIG. 2 exemplified by the bottom view along line 8-8 of FIG. 7 in a eighth embodiment of the present invention.

Referring now to FIG. 11, therein is shown a cross-sectional view of an integrated circuit package-on-package system 1100 having the integrated circuit package system 100 of FIG. 2 exemplified by the bottom view along line 8-8 of FIG. 7 in a eighth embodiment of the present invention. A first device structure 1106, such as a laminate substrate, a structure with redistribution layer (RDL), or an integrated circuit device, preferably mounts over a package substrate 1104. The integrated circuit package system 100 preferably mounts over the first device structure 1106. Conductive structures 1110, such as solder bumps, connect the first device structure 1106 to both the integrated circuit package system 100 and the package substrate 1104.

The integrated circuit package system 100 also preferably connects to the package substrate 1104 with first internal interconnects 1108, such as solder balls or solder bumps. The first internal interconnects 1108 preferably connects to the bottom connection structure 210 of the integrated circuit package system 100.

Second internal interconnects 1112, such as bond wires or ribbon bond wires, preferably connect the first peripheral pads 104 of the top connection structure 102 and the package substrate 1104. A package encapsulation 1118, such as an epoxy molding compound (EMC), covers the first device structure 1106, the first internal interconnects 1108, and the second internal interconnects 1112 over the package substrate 1104. The package encapsulation 1118 preferably includes a recess 1120 exposing the first interior pads 106 of the top connection structure 102.

A second device structure 1122, such as an encapsulated integrated circuit, preferably mounts over the first interior pads 106 in the recess 1120 forming the integrated circuit package-on-package system 1100. Conductive balls 1124, such as solder balls, preferably connect the second device structure 1122 and the first interior pads 106 of the integrated circuit package system 100.

As mentioned earlier, the integrated circuit package system 100 preferably provides a dual connection options from the top and the bottom with the top connection structure 102 and the bottom connection structure 210. The top connection structure 102 may preferably provide electrical connection paths between the second device structure 1122 to the other portions of the integrated circuit package-on-package system 1100 and to the next system level (not shown), such as a printed circuit board or another integrated circuit package system, through external interconnects 1102. The bottom connection structure 210 preferably provides electrical connection paths between the integrated circuit package system 100 to the other portions of the integrated circuit package-on-package system 1100 and also to the next system level.

Figure 12:
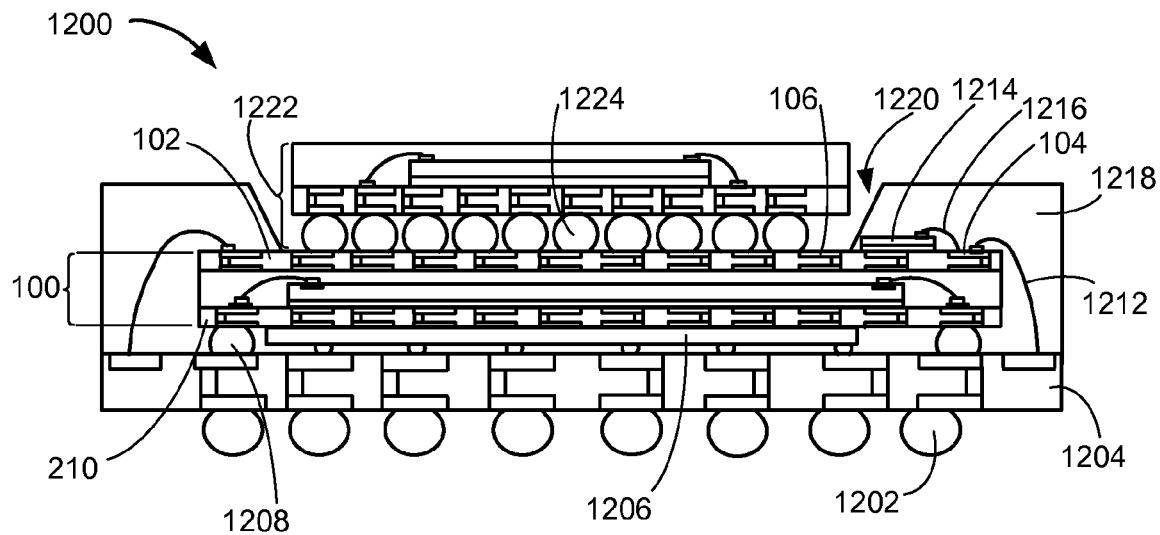
FIG. 12 is a cross-sectional view of an integrated circuit package-on-package system having the integrated circuit package system of FIG. 2 exemplified by the bottom view along line 8-8 of FIG. 7 in a ninth embodiment of the present invention.

Referring now to FIG. 12, therein is shown a cross-sectional view of an integrated circuit package-on-package system 1200 having the integrated circuit package system 100 of FIG. 2 exemplified by the bottom view along line 8-8 of FIG. 7 in a ninth embodiment of the present invention. A first device structure 1206, such as a flip chip, preferably mounts over a package substrate 1204. The integrated circuit package system 100 preferably mounts over the first device structure 1206 and preferably connects to the package substrate 1204 with first internal interconnects 1208, such as solder balls or solder bumps. The first internal interconnects 1208 preferably connects to the bottom connection structure 210 of the integrated circuit package system 100.

Second internal interconnects 1212, such as bond wires or ribbon bond wires, preferably connect the first peripheral pads 104 of the top connection structure 102 and the package substrate 1204. An embedded device 1214 is preferably over the top connection structure 102 of the integrated circuit package system 100 without impeding the connections of the second internal interconnects 1212. The embedded device 1214 may represent a number of structures. For example, the embedded device 1214 may be an integrated circuit die, a structure providing a redistribution layer (RDL), or a combination thereof. Third internal interconnects 1216, such as bond wires or ribbon bond wires, preferably electrically connect the embedded device 1214 and the first peripheral pads 104.

A package encapsulation 1218, such as an epoxy molding compound (EMC), covers the first device structure 1206, the first internal interconnects 1208, the second internal interconnects 1212, the embedded device 1214, and the third internal interconnects 1216 over the package substrate 1204. The package encapsulation 1218 preferably includes a recess 1220 exposing the first interior pads 106 of the top connection structure 102.

A second device structure 1222, such as an encapsulated integrated circuit, preferably mounts over the first interior pads 106 in the recess 1220. Conductive balls 1224, such as solder balls, preferably connect the second device structure 1222 and the first interior pads 106 of the integrated circuit package system 100.

As mentioned earlier, the integrated circuit package system 100 preferably provides a dual connection options from the top and the bottom with the top connection structure 102 and the bottom connection structure 210. The top connection structure 102 may preferably provide electrical connection paths between the second device structure 1222 to the other portions of the integrated circuit package-on-package system 1200 and to the next system level (not shown), such as a printed circuit board or another integrated circuit package system, through external interconnects 1202, such as solder balls. The external interconnects 1202 preferably attach to and below the package substrate 1204. The bottom connection structure 210 preferably provides electrical connection paths between the integrated circuit package system 100 to the other portions of the integrated circuit package-on-package system 1200 and also to the next system level.

Figure 13:
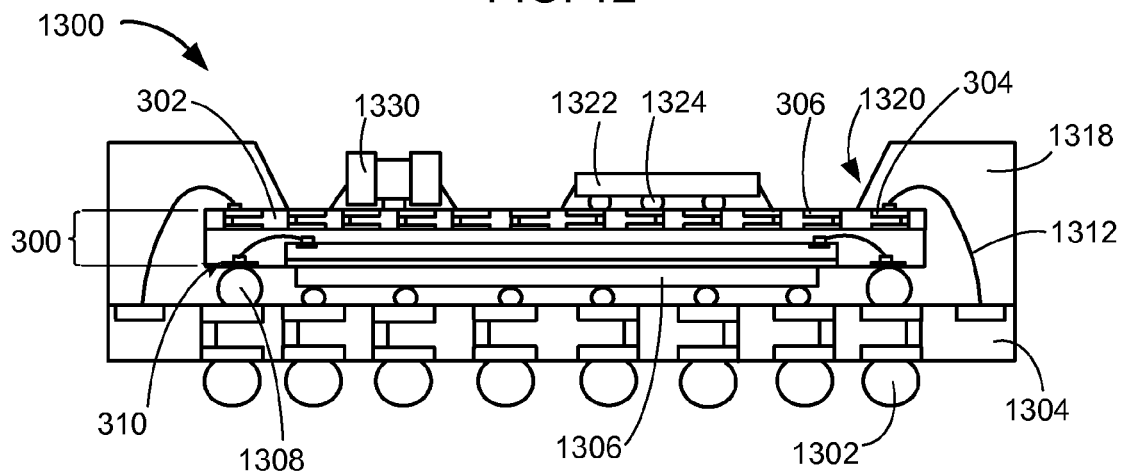
FIG. 13 is a cross-sectional view of an integrated circuit package-on-package system having the integrated circuit package system of FIG. 3 exemplified by the bottom view along line 8-8 of FIG. 7 in a tenth embodiment of the present invention.

Referring now to FIG. 13, therein is shown a cross-sectional view of an integrated circuit package-on-package system 1300 having the integrated circuit package system 300 of FIG. 3 exemplified by the bottom view along line 8-8 of FIG. 7 in a tenth embodiment of the present invention. A first device structure 1306, such as a flip chip, preferably mounts over a package substrate 1304. The integrated circuit package system 300 preferably mounts over the first device structure 1306 and preferably connects to the package substrate 1304 with first internal interconnects 1308, such as solder balls or solder bumps. The first internal interconnects 1308 preferably connects to the bottom connection structure 310 of the integrated circuit package system 300.

Second internal interconnects 1312, such as bond wires or ribbon bond wires, preferably connect the first peripheral pads 304 of the top connection structure 302 and the package substrate 1304. A package encapsulation 1318, such as an epoxy molding compound (EMC), covers the first device structure 1306, the first internal interconnects 1308, and the second internal interconnects 1312 over the package substrate 1304. The package encapsulation 1318 preferably includes a recess 1320 exposing the first interior pads 306 of the top connection structure 302.

A second device structure 1322, such as a flip chip, preferably mounts over the first interior pads 306 in the recess 1320. Conductive balls 1324, such as solder bumps, preferably connect the second device structure 1322 and the first interior pads 306 of the integrated circuit package system 300. A third device structure 1330, such as a passive device, also preferably mounts over the first interior pads 306 in the recess 1320.

As mentioned earlier, the integrated circuit package system 300 preferably provides a dual connection options from the top and the bottom with the top connection structure 302 and the bottom connection structure 310. The top connection structure 302 may preferably provide electrical connection paths between the second device structure 1322, the third device structure 1330, or a combination thereof to the other portions of the integrated circuit package-on-package system 1300 and to the next system level (not shown), such as a printed circuit board or another integrated circuit package system, through external interconnects 1302. The bottom connection structure 310 preferably provides electrical connection paths between the integrated circuit package system 300 to the other portions of the integrated circuit package-on-package system 1300 and also to the next system level.

Figure 14:
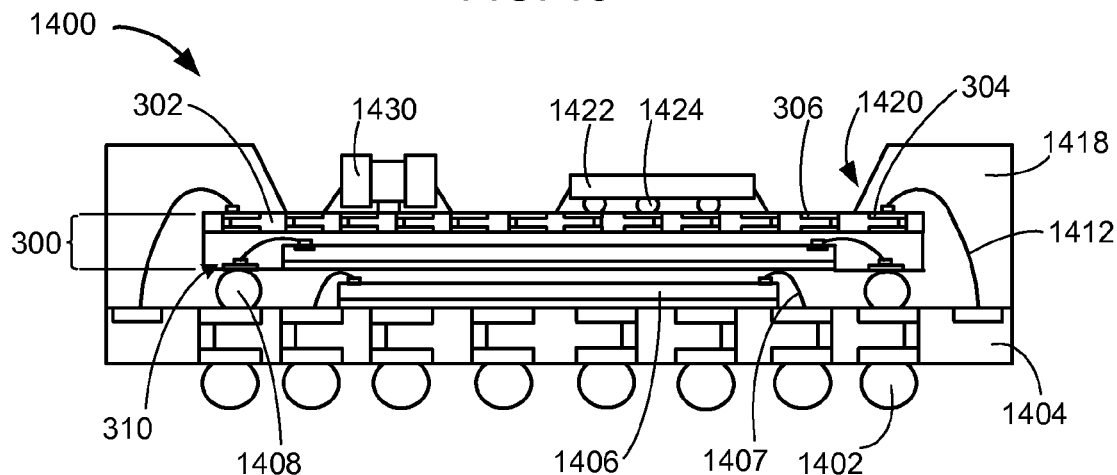
FIG. 14 is a cross-sectional view of an integrated circuit package-on-package system having the integrated circuit package system of FIG. 3 exemplified by the bottom view along line 8-8 of FIG. 7 in a eleventh embodiment of the present invention.

Referring now to FIG. 14, therein is shown a cross-sectional view of an integrated circuit package-on-package system 1400 having the integrated circuit package system 300 of FIG. 3 exemplified by the bottom view along line 8-8 of FIG. 7 in a eleventh embodiment of the present invention. A first device structure 1406, such as an integrated circuit die, preferably mounts over a package substrate 1404. The integrated circuit package system 300 preferably mounts over the first device structure 1406 without impeding electrical connectors 1407, such as bond wires or ribbon bond wires, between the first device structure 1406 and the package substrate 1404. The integrated circuit package system 300 preferably connects to the package substrate 1404 with first internal interconnects 1408, such as solder balls or solder bumps. The first internal interconnects 1408 preferably connects to the bottom connection structure 310 of the integrated circuit package system 300.

Second internal interconnects 1412, such as bond wires or ribbon bond wires, preferably connect the first peripheral pads 304 of the top connection structure 302 and the package substrate 1404. A package encapsulation 1418, such as an epoxy molding compound (EMC), covers the first device structure 1406, the electrical connectors 1407, the first internal interconnects 1408, and the second internal interconnects 1412 over the package substrate 1404. The package encapsulation 1418 preferably includes a recess 1420 exposing the first interior pads 306 of the top connection structure 302.

A second device structure 1422, such as a flip chip, preferably mounts over the first interior pads 306 in the recess 1420. Conductive balls 1424, such as solder bumps, preferably connect the second device structure 1422 and the first interior pads 306 of the integrated circuit package system 300. A third device structure 1430, such as a passive device, also preferably mounts over the first interior pads 306 in the recess 1420.

As mentioned earlier, the integrated circuit package system 300 preferably provides a dual connection options from the top and the bottom with the top connection structure 302 and the bottom connection structure 310. The top connection structure 302 may preferably provide electrical connection paths between the second device structure 1422, the third device structure 1430, or a combination thereof to the other portions of the integrated circuit package-on-package system 1400 and to the next system level (not shown), such as a printed circuit board or another integrated circuit package system, through external interconnects 1402. The bottom connection structure 310 preferably provides electrical connection paths between the integrated circuit package system 300 to the other portions of the integrated circuit package-on-package system 1400 and also to the next system level.

Figure 15:
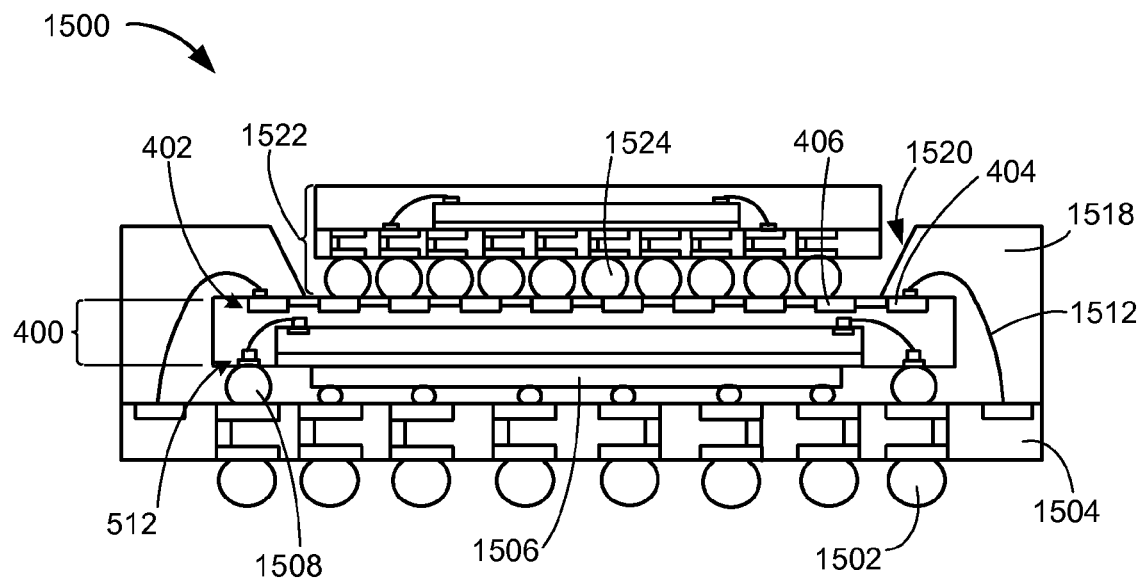
FIG. 15 is a cross-sectional view of an integrated circuit package-on-package system having the integrated circuit package system of FIG. 5 exemplified by the bottom view along line 8-8 of FIG. 7 in a twelve embodiment of the present invention.

Referring now to FIG. 15, therein is shown a cross-sectional view of an integrated circuit package-on-package system 1500 having the integrated circuit package system 400 of FIG. 5 exemplified by the bottom view along line 8-8 of FIG. 7 in a twelve embodiment of the present invention. A first device structure 1506, such as a flip chip, preferably mounts over a package substrate 1504. The integrated circuit package system 400 preferably mounts over the first device structure 1506 and preferably connects to the package substrate 1504 with first internal interconnects 1508, such as solder balls or solder bumps. The first internal interconnects 1508 preferably connects to the bottom connection structure 512 of the integrated circuit package system 400.

Second internal interconnects 1512, such as bond wires or ribbon bond wires, preferably connect the first peripheral pads 404 of the top connection structure 402 and the package substrate 1504. A package encapsulation 1518, such as an epoxy molding compound (EMC), covers the first device structure 1506, the first internal interconnects 1508, and the second internal interconnects 1512 over the package substrate 1504. The package encapsulation 1518 preferably includes a recess 1520 exposing the first interior pads 406 of the top connection structure 402.

A second device structure 1522, such as an encapsulated integrated circuit, preferably mounts over the first interior pads 406 in the recess 1520 forming the integrated circuit package-on-package system 1500. Conductive balls 1524, such as solder bumps, preferably connect the second device structure 1522 and the first interior pads 406 of the integrated circuit package system 400.

As mentioned earlier, the integrated circuit package system 400 preferably provides a dual connection options from the top and the bottom with the top connection structure 402 and the bottom connection structure 512. The top connection structure 402 may preferably provide electrical connection paths between the second device structure 1522 to the other portions of the integrated circuit package-on-package system 1500 and to the next system level (not shown), such as a printed circuit board or another integrated circuit package system, through external interconnects 1502. The bottom connection structure 512 preferably provides electrical connection paths between the integrated circuit package system 400 to the other portions of the integrated circuit package-on-package system 1500 and also to the next system level.

Figure 16:
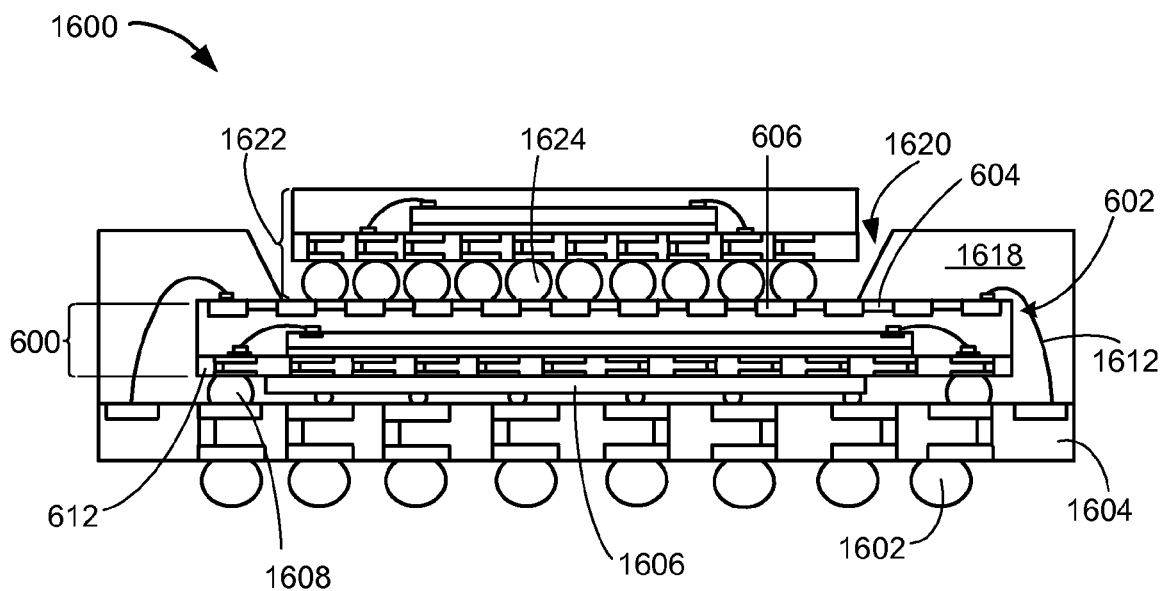
FIG. 16 is a cross-sectional view of an integrated circuit package-on-package system having the integrated circuit package system of FIG. 6 exemplified by the bottom view along line 8-8 of FIG. 7 in a twelve embodiment of the present invention.

Referring now to FIG. 16, therein is shown a cross-sectional view of an integrated circuit package-on-package system 1600 having the integrated circuit package system 600 of FIG. 6 exemplified by the bottom view along line 8-8 of FIG. 7 in a twelve embodiment of the present invention. A first device structure 1606, such as a flip chip, preferably mounts over a package substrate 1604. The integrated circuit package system 600 preferably mounts over the first device structure 1606 and preferably connects to the package substrate 1604 with first internal interconnects 1608, such as solder balls or solder bumps. The first internal interconnects 1608 preferably connects to the bottom connection structure 612 of the integrated circuit package system 600.

Second internal interconnects 1612, such as bond wires or ribbon bond wires, preferably connect the first peripheral pads 604 of the top connection structure 602 and the package substrate 1604. A package encapsulation 1618, such as an epoxy molding compound (EMC), covers the first device structure 1606, the first internal interconnects 1608, and the second internal interconnects 1612 over the package substrate 1604. The package encapsulation 1618 preferably includes a recess 1620 exposing the first interior pads 606 of the top connection structure 602.

A second device structure 1622, such as an encapsulated integrated circuit, preferably mounts over the first peripheral pads 604 in the recess 1620 forming the integrated circuit package-on-package system 1600. Conductive balls 1624, such as solder bumps, preferably connect the second device structure 1622 and the first interior pads 606 of the integrated circuit package system 600.

As mentioned earlier, the integrated circuit package system 600 preferably provides a dual connection options from the top and the bottom with the top connection structure 602 and the bottom connection structure 612. The top connection structure 602 may preferably provide electrical connection paths between the second device structure 1622 to the other portions of the integrated circuit package-on-package system 1600 and to the next system level (not shown), such as a printed circuit board or another integrated circuit package system, through external interconnects 1602. The bottom connection structure 612 preferably provides electrical connection paths between the integrated circuit package system 600 to the other portions of the integrated circuit package-on-package system 1600 and also to the next system level.

Figure 17:
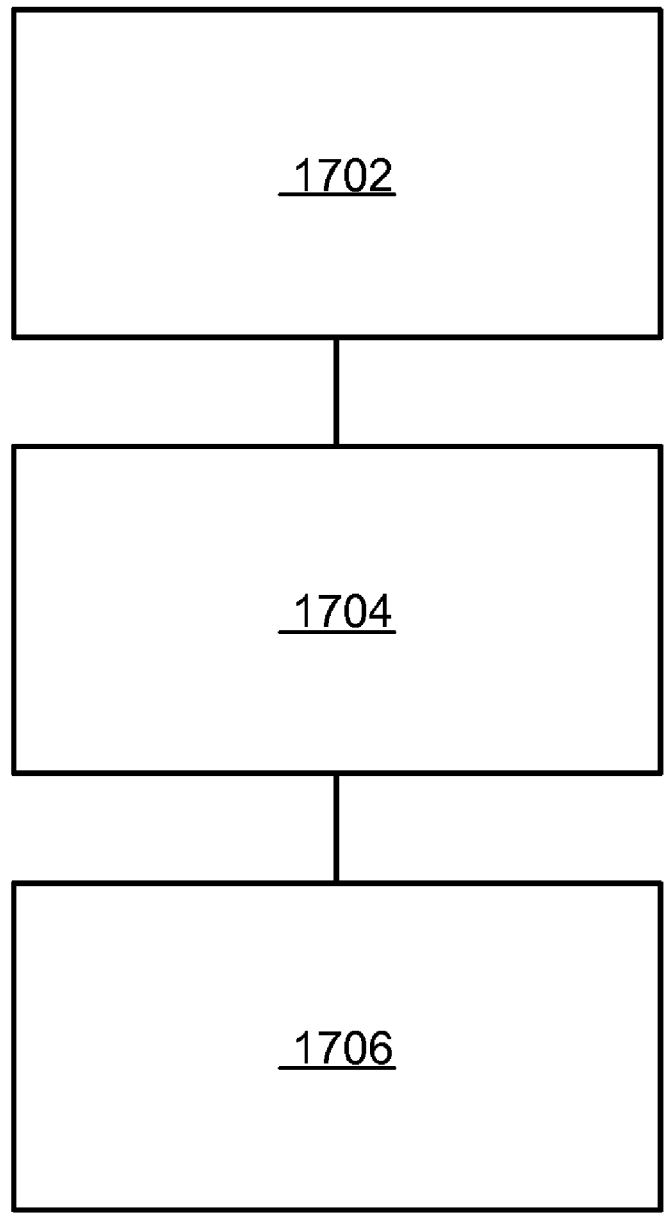
FIG. 17 is a flow chart of an integrated circuit package system for manufacturing the integrated circuit package system in an embodiment of the present invention.

Referring now to FIG. 17, therein is shown a flow chart of an integrated circuit package system 1700 for manufacturing the integrated circuit package system 100 in an embodiment of the present invention. The system 1700 includes connecting an integrated circuit die with a bottom connection structure in a block 1702; placing an adhesive encapsulation over the integrated circuit die and the bottom connection structure with the bottom connection structure exposed in a block 1704; and placing a top connection structure over the adhesive encapsulation at an opposing side to the bottom connection structure in a block 1706.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:

mounting an integrated circuit die having a non-active side and an active side over a bottom connection structure with the non-active side facing the bottom connection structure;

connecting the integrated circuit die with the bottom connection structure;

placing an adhesive encapsulation over the integrated circuit die and the bottom connection structure with the bottom connection structure exposed;

placing a top connection structure over the adhesive encapsulation at an opposing side to the bottom connection structure and facing the active side of the integrated circuit die;

connecting a package substrate with the bottom connection structure mounted thereover;

connecting the package substrate with the top connection structure;

forming, a package encapsulation having a recess with the recess exposing a portion of the top connection structure; and mounting a first device structure over the top connection structure in the recess.

2. The method as claimed in claim 1 further comprising: connecting the package substrate with a second device structure mounted thereover; connecting the second device structure with the bottom connection structure mounted thereover.

3. An integrated circuit package system comprising:

a bottom connection structure;

an integrated circuit die having a non-active side and an active side over the bottom connection structure with the non-active side facing the bottom connection structure, the integrated circuit die connected with the bottom connection structure;

an adhesive encapsulation over the integrated circuit die and the bottom connection structure with the bottom connection structure exposed;

a top connection structure over the adhesive encapsulation at an opposing side to the bottom connection structure;

a package substrate connected with the bottom connection structure mounted thereover and connected with the top connection structure;

a package encapsulation having a recess with the recess exposing a portion of the top connection structure; and a first device structure over the top connection structure in the recess.

4. The system as claimed in claim 3 further comprising: a backside adhesive attached with a non-active side of the integrated circuit die.

5. The system as claimed in claim 3 wherein the top connection structure over the adhesive encapsulation includes the top connection structure exposed by the adhesive encapsulation.

6. The system as claimed in claim 3 wherein the top connection structure over the adhesive encapsulation includes the top connection structure surrounded by the adhesive encapsulation with the top connection structure exposed.

7. The system as claimed in claim 3 further comprising: the package substrate connected with a second device structure mounted thereover and connected with the top connection structure; and the second device structure connected with the bottom connection structure mounted thereover.

* * * * *